United States Patent [19]

Ueta et al.

[11] Patent Number: 5,487,019

[45] Date of Patent: Jan. 23, 1996

[54] DIGITAL DATA TRANSFER METHOD

[75] Inventors: Motomu Ueta; Tetsuya Harada, both of Kanagawa, Japan

[73] Assignee: Sony Corporation, Tokyo, Japan

[21] Appl. No.: 219,708

[22] Filed: Mar. 29, 1994

[30] Foreign Application Priority Data

Mar. 31, 1993 [JP] Japan .................................. 5-094992

[51] Int. Cl.$^6$ .................................................. G06F 17/00
[52] U.S. Cl. ........................................................ 364/514 R
[58] Field of Search ......................... 364/514 R, 715.03; 341/60, 67, 95

[56] References Cited

U.S. PATENT DOCUMENTS

| | | | |
|---|---|---|---|
| 4,433,327 | 2/1984 | Vallet et al. | 364/715.03 |
| 4,899,146 | 2/1990 | Podolak et al. | 364/715.03 |
| 5,038,309 | 8/1991 | Priem et al. | 364/715.03 |

OTHER PUBLICATIONS

Nicholas et al; "Data Communication For Microcomputers", 1982, pp. 35–37. (Parallel to Serial conversion).

Primary Examiner—Ellis B. Ramirez
Attorney, Agent, or Firm—Jay H. Maioli

[57] ABSTRACT

An m bit (where m is a positive integer greater than or equal to 2) digital data transmission format, using M ($2^m$) expressible data values where L items of data included within K data items which start from the minimum value are inhibit codes, in such a manner that (N*m) bit (where N is a positive integer greater than or equal to 2) digital data Z is divided into N items of m bit digital data V1 to VN according to

$$Z = \Sigma_{n=1}^{N} \{(M-L)n-1(Vn-K)\}$$

so that digital depth data of 20 bits or more can be transmitted effectively using, for example, a 10 bit digital video data transmission format.

4 Claims, 5 Drawing Sheets

DIGITAL DATA TRANSFER METHOD

BACKGROUND OF THE INVENTION

1. Field of the Invention

The present invention relates to a digital data transmission method for transmitting digital data such as depth data for digital image processing apparatus in a transmission format which has a bit number which is smaller than the original bit number for this digital data.

2. Description of the Prior Art

In the prior art, digital data such as depth data for digital image processing apparatus has been expressed using at least 20 bits. Digital video data, on the other hand, has been expressed using 10 bit digital data, a number which is smaller than the number for the depth data. Transfer formats for transferring 10 bit digital video data have therefore been put forward.

This 10 bit digital video data is described using 1024 ($2^{10}$) values from 000h to 3FFh. Here, h indicates that the numeric value which preceded h was hexadecimal However, in this digital video data transmission format, the four values from 000h to 003h and the four values from 3FCh to 3FFh, giving a total of 8 values, are used to correspond to forbidden codes. These forbidden codes are used for the transmission of information such as control information and information other than picture data. It follows that the values which can be used to correspond to codes for picture data in the digital video data are the 1016 codes ranging from 004h to 3FBh.

Various benefits such as the common use of transmission control equipment can be enjoyed if 20 bit digital data such as depth data can be transmitted in accordance with the transmission format for this kind of 10 bit digital data. According to the transfer format for 10 bit digital data, digital data of 20 bits or greater such as the depth data would have to be divided every 10 bits to be transmitted i.e. if the data to be transmitted consists of 20 bits, this would have to be divided into two items of 10 bit upper and 10 bit lower digital data.

However, if the 20 bit digital data is split up every ten bits, it is possible that one or both items of 10 bit digital data V2 and V1 may correspond to the forbidden codes. As these forbidden codes correspond to specific meanings, even if they are transmitted, their meaning will not correspond to that of the original data and mistakes will be made.

In the prior art, when transferring 20 bit digital data in accordance with the transmission format for 10 bit digital data which has forbidden codes, a limiter is used so that the forbidden codes are not transmitted i.e. the upper bits would be kept without the values 000h to 003h and 3FC to 3FF by a limiter.

However, if a limiter is also used to cut the forbidden codes from the lower bits, the value corresponding to the transmitted data is no longer continuous. That is if data from 3FCh to 003h in the lower bits is limited, with regards to the transmitted 20 bit digital data, the value following 01FFBh comes to be expressed as 02004h, and the value following 02FFBh comes to be expressed as 03004h, so that the values 01FFCh to 02003h, 02FFCh to 03003h and 03FFCh to 04003h become lost.

In the above, 20 bit data is divided up every 10 bits to be transmitted in accordance with the transmission format for 10 bit data having forbidden codes. This is done as if the lower bits not contain the forbidden codes i.e. even if there is an forbidden code in the lower 10 bits it is still just treated as usual data. However, as this runs contrary to the transmission format, it is not possible to use this lower bit digital data in the same way as digital video data.

Also, one bit of the lower bits can be used for the prevention of the generation of forbidden codes. For example, the most significant bit of the lower bits could be used for this purpose instead of for data, so that the data from the second most significant bit onwards could then be used for data so that it would no longer be possible to get forbidden codes in the lower bits. This would, however, mean that it would now be possible to only transmit the number of values which could be represented by 19 bits of digital data ($2^{19}$). The resolution provided by 19 bits would not be sufficient for transmitting data such as depth data.

As the present invention sets out to solve these kinds of problems, its object is to provide a digital data transmission method in which a transmission format having forbidden codes transmits a predetermined number of bits at a time (i.e. 10), in such a manner that when digital data having a number of bits which is larger than the predetermined bit number in the transmission format (i.e. 20) is handled, this digital data can be transmitted efficiently and accurately in accordance with the transmission format.

SUMMARY OF THE INVENTION

In order to attain the aforementioned object, in the present invention, a digital data transfer method with m taken to be a positive integer greater than or equal to 2 and M taken to be the number of values representable by m bits of digital data $2^m$ in such a manner that, within the M values, digital data corresponding to the first K values starting from a minimum value represent forbidden codes, and (N*m) bit digital data Z with N taken to be a positive integer greater than or equal to 2 is transferred using an m bit digital data transfer format where digital data corresponding to L values included in the M values represent forbidden codes, comprises the steps of (a) dividing the digital data Z up into N items of m bit digital data $V_1$ to $V_N$, where $$Z = \Sigma_{n=1}^{N} \{(M-L)^{n-1}(V_n - K)\} \text{ and}$$

$$Z = (M-L)^{N-1}(V_N - K) + (M-L)^{N-2}(V_{N-1} - K) +$$
$$(M-L)^{N-3}(V_{N-2} - K) + \ldots +$$
$$(M-L)(V_2 - K) + (V_1 - K),$$

(b) transferring digital data obtained in step (a) using the transfer format, (c) receiving the digital data and (d) restoring the received digital data to the form of the digital data Z based on the equation $$Z = \Sigma_{n=1}^{N} \{(M-L)^{n-1}(V_n - K)\}.$$

If m then equals 10, the transmission format becomes a 10 bit digital transmission format, and M is $2^{10}=1024$. If N is then taken to be 2, the digital data Z is then 20 bit digital data. Also, a 10 bit digital data transmission format is the data transmission format for digital video data. In this digital video data transmission format, the number of inhibit codes L is 8, which leaves (M–L) values i.e. 1016 values which can be used for video data.

Also, a digital data transfer method with M taken to be the number of values representable by m bits of digital data $2^m$ in such a manner that, within the M values, digital data corresponding to the first K values starting from a minimum value represent forbidden codes, uses an m bit digital data transfer format in which digital data is expressed in (N*m) bits where N and m are positive integers greater than or equal to 2 and where the digital data Z to be transferred is made up of data corresponding to values from zero to a maximum value R which is less than $(M-L)^N$, comprises the steps of (a) dividing the digital data Z up into N items of m bit digital data $V_1$ to $V_N$, (b) if (N*m) bit digital data is such that, when divided up in the step (a), any of the N items of m bit digital data $V_1$ to $V_N$ will represent data for forbidden codes, such (N*m) bit digital data which is greater than the maximum value R will be replaced with pre-set (N*m) bit digital data chosen in such a manner that none of the N items of m bit digital data $V_1$ to $V_N$ will represent forbidden codes when (N*m) bit digital data is divided up, with this substituted (N*m) bit digital data then being divided up every m bits into N items of m bit digital data V1 to VN, which are then transmitted, (c) receiving transmitted digital data and (d) restoring received items of digital data $V_1$ to $V_N$ to (N*m) bit digital data form.

Further, in each of the digital transmission methods described above for this invention, the digital data Z may be depth data for digital image processing apparatus.

In the digital data transmission method for this invention, the (N*m) bit digital data Z can be expressed by $$Z = \Sigma_{n=1}^{N} \{(M-L)^{n-1}(V_n - K)\} \qquad \text{(Eqn. 2)}$$

$$Z = (M-L)^{N-1}(V_n - K) + (M-L)^{N-2}(V_{N-1} - K) +$$
$$(M-L)^{N-3}(V_{N-2} - K) + \ldots +$$
$$(M-L)(V_2 - K) + (V_1 - K)$$

where N items of m bit digital data $V_1$ to $V_N$ are divided up and transmitted. Here, M represents the number of values which can be expressed by the m bits of digital data i.e. $2^m$, K represents the number of values going sequentially starting from the minimum value within the M values which represent forbidden codes in this transmission format and L is the total number of values which are forbidden codes included in the M values. It follows that in the digital data Z, the first K values from the minimum value within the M values correspond to digital data for forbidden codes. L values within these M values correspond to digital data for forbidden codes. This information can then be transmitted without the forbidden code depending on the transmission format for the m bit digital data. This transmitted digital data Z is then returned to its original form on the receiving side in accordance with the following equation.

$$Z = \Sigma_{n=1}^{N} \{(M-L)^{n-1}(V_n - K)\}$$

Also, in a digital data transmission method for this invention, (N*m) bit digital data Z (where N and m are positive integers greater than or equal to 2) is to be transferred as data with a value of 0 to a maximum value of R where this maximum value R is less than $(M-L)^N$. This digital data Z is divided up every m bits into N, m bit packets of digital data $V_1$ to $V_N$, and then transmitted. Here, M is the number of values which can be expressed by the m bit digital data i.e. 2 m and L is the number of values within the transmission format which are forbidden codes.

If any of the N items of m bit digital data $V_1$ to $V_N$ represent forbidden codes, the (N*m) bit digital data will be replaced with preset digital data that does not contain any forbidden codes.

When this (N*m) bit digital data divided up into N items of m bit digital data ranging from $V_1$ to $V_N$ by identifying when has exceeded the maximum value R in such a manner that any of these values may become an forbidden code, these forbidden code values may be substituted with preset (N*m) bit digital data which does not contain any forbidden codes. This substituted (N*m) bit digital data is then divided up every m bits and transmitted as N items of m bit digital data $V_1$ to $V_N$.

It therefore follows that because L values of the M values within the digital data Z correspond to digital data for forbidden codes, by using an N bit digital transfer format, transmission which does not include these inhibit bits can be carried out. Each of the items of digital data $V_1$ to $V_N$ can then be returned to being (N*m) bit digital data on the receiving side.

Furthermore, in each of the above digital data transmission methods, when the digital data Z is used as the depth data for image processing apparatus, a digital data Z which is 20 bits in length will provide sufficient resolution.

DETAILED DESCRIPTION OF THE PREFERRED EMBODIMENT

Embodiment

With the digital data transfer method in this invention, (N*m) bits (where N and m represent positive integers greater or equal to 2) of digital data Z are transferred using a m bit digital data transfer format.

The digital data Z can be depth data for digital image processing apparatus. When depth information is included in the picture this digital image processing apparatus can give a three dimensional representation, and various image processing such as transforming, rotating, enlarging and compressing of the picture can be carried out. Twenty bit (N=2, m=10) data which provides sufficient resolution, is used as the data length for expressing the depth information.

The m bit digital data transfer format is a digital video data transfer format. This digital video data is expressed as 10 bit (m=10) digital data. There are 1024 ($2^{10}$) values for this digital video data ranging from 000h to 3FFh. Here, h indicates that the numeric values which preceded h is hexadecimal. With regards to the transfer format for transferring this 10 bit digital video data, the code corresponding to the four values from 000h to 003h and the four values from 3FCh to 3FFh, giving a total of 8 codes, are forbidden codes. These forbidden codes are used for transferring various information such as control information or information other than picture information. The codes corresponding to the values for displaying the picture data in the digital video data are then the codes from 004h to 3FBh i.e. 16 values.

In the following, a specific embodiment of this invention will be described with reference to the diagrams, where 20 bit data Z is taken as the (N*m) bit digital data Z and a 10 bit digital video data format V is taken as the m bit digital data transfer format.

In a first digital data transfer method for this invention, the (N*m) bit digital data Z can be expressed by $$Z = \sum_{n=1}^{N} \{(M-L)^{n-1}(V_n - K)\} \quad \text{(Eqn. 1)}$$

i.e.

$$Z = (M-L)^{N-1}(V_n - K) + \quad \text{(Eqn. 2)}$$
$$(M-L)^{N-2}(V_N - 1 - K) + (M-L)^{N-3}(V_{N-2} - K) + \ldots +$$
$$(M-L)(V_2 - K) + (V_1 - K)$$

where N items of m bit digital data $V_1$ to $V_N$ are divided up and transmitted.

Figure 1:
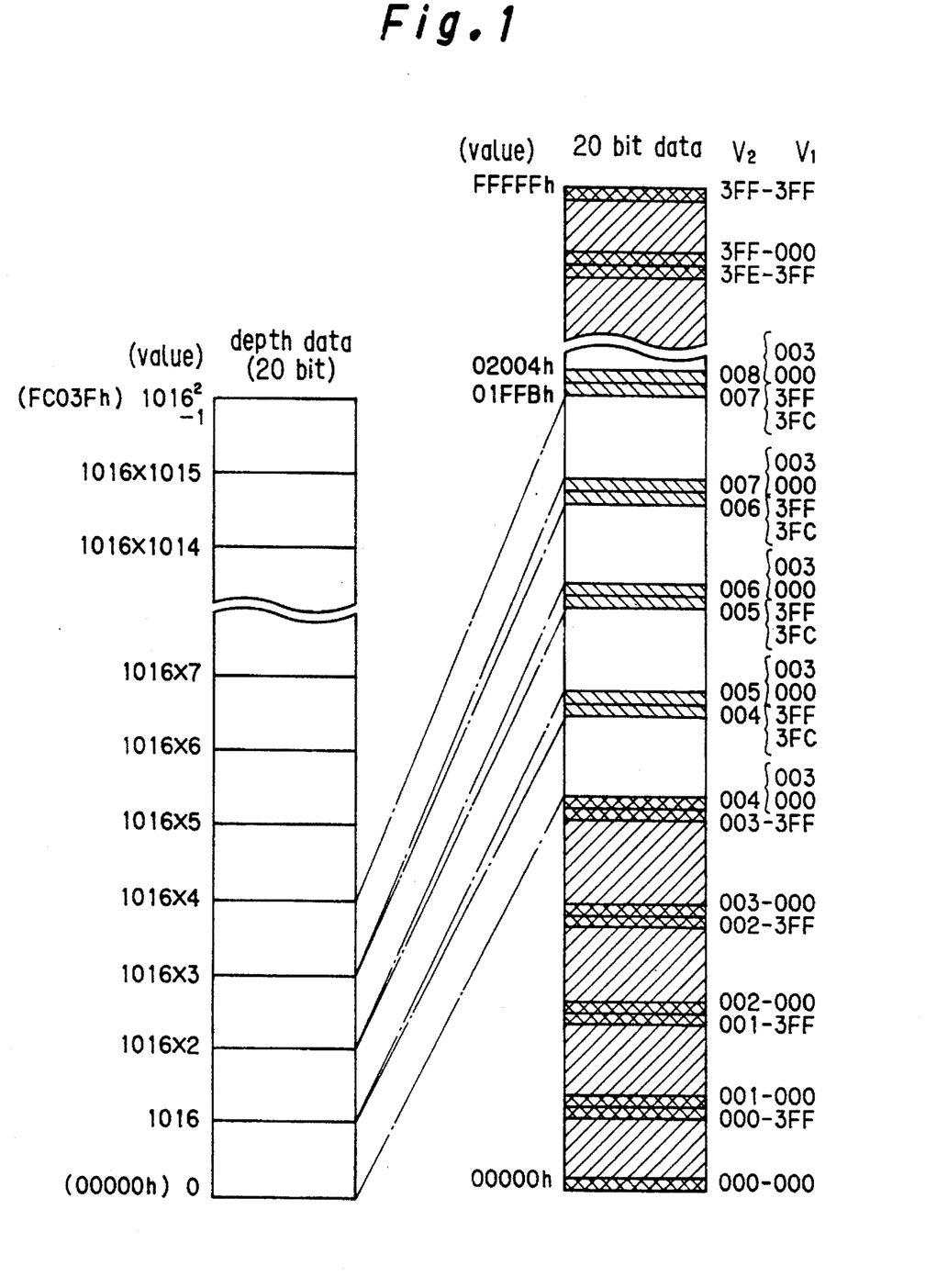
FIG. 1 is a block view describing the depth data Z handled in a first digital data transmission method for this invention.
Figure 2:
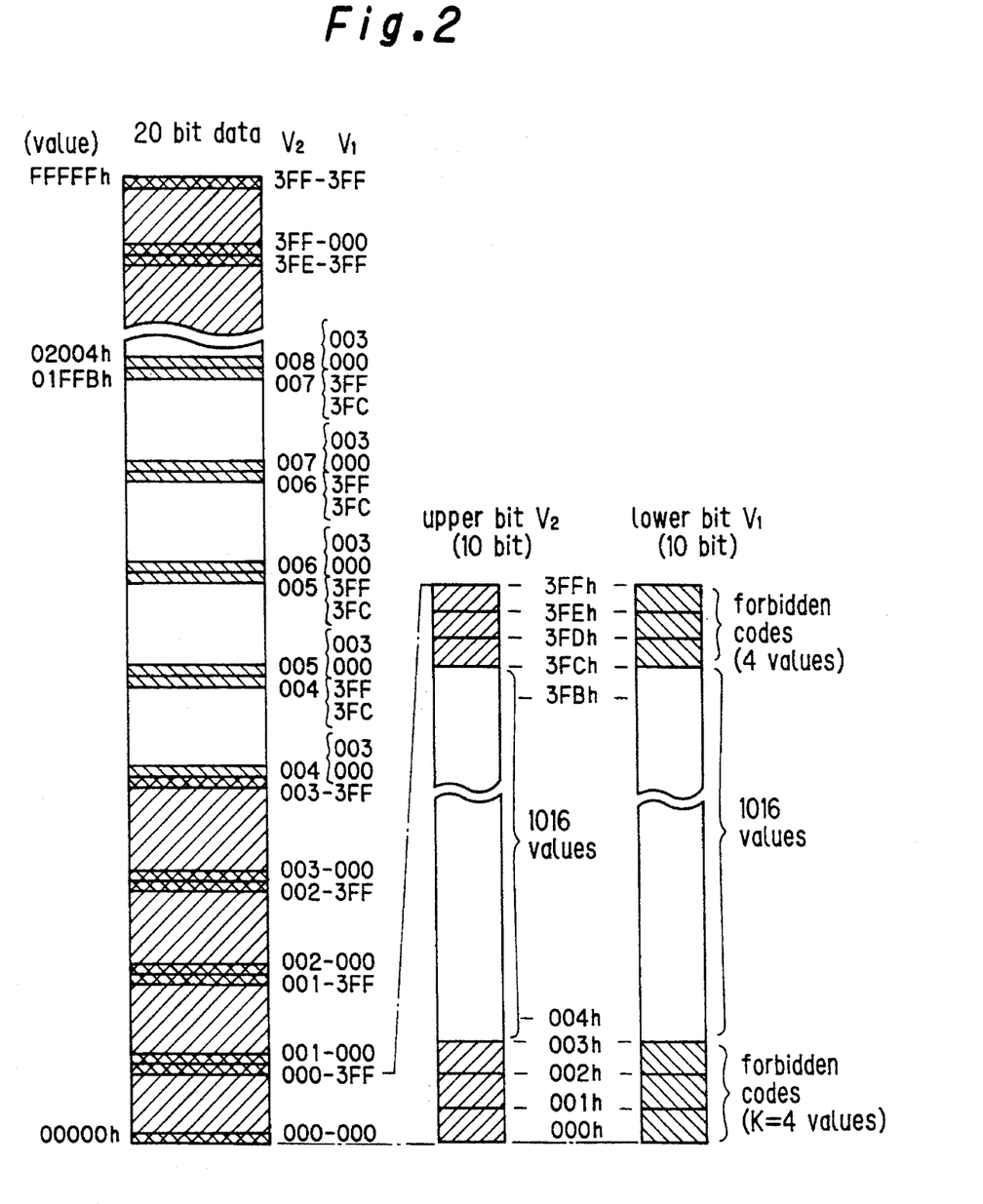
FIG. 2 is a graph describing the first digital data transmission method.

The depth data Z, as is shown in FIG. 1, consists of 20 bits of digital data including 10 upper and 10 lower bits of digital data selected so as not to be forbidden codes. In FIG. 2 the 20 bits of digital data is divided into 10 upper bits $V_2$ and 10 lower bits $V_1$. M which can be represented by number of values which represent the m bit digital data i.e. $2^m$, here $2^{10}=1024$. The character K represents the number of values within M which are forbidden codes running sequentially starting from the minimum value in the transfer format i.e. the four values from 000h to 0003h. The character L represents the total number of values which are forbidden codes in the M values in the transfer format, i.e. the 4 values 000h to 003h, along with the 4 values from 3FCh (=1020) to 3FFh (1023) giving a total of eight values. The depth data Z therefore becomes $$Z=(1024-8)(V_2-4)+(V_1-4) \quad \text{(Eqn. 3)}$$

so that it is divided between the upper bits $V_2$ and the lower bits $V_1$. The upper bits $V_2$ and the lower bits $V_1$ therefore become $$1020 > V_2 \geq 4 \text{ and } 1020 > V_1 \geq 4 \quad \text{(Eqn. 4)}$$

According to the transformation in equation 3, the upper and lower bits $V_2$ and $V_1$ will not become forbidden codes, and will be transmitted, as is shown in FIG. 1, expressed as the successive values of data 0 to 1032255 (=$1016^2$ or FC03Fh). As the possible values for 20 bit digital data are 0 to 1048575, the depth data Z is transmitted as digital data which has a resolution close to 20 bit resolution.

Also, this kind of transmitted signal can then be returned to its original state on the receiving signal side according to $$Z = \sum_{n=1}^{N} \{(M-L)n - 1(V_n - K)\}$$

i.e. the depth data can be returned to its original state according to $$Z = \sum_{n=1}^{N} \{(1016)n - 1(V_n - 4)\} \quad \text{(Eqn. 5)}$$
$$= 1016(V_2 - 4) + (V_1 - 4)$$

With the first digital transmission method for this kind of invention, the digital data corresponding to the first K values starting from the minimum value within the M (=$2^m$) values which express m bit digital data are forbidden codes. By then having a transmission format whereby L values within these M values correspond to m-bit digital data of inhibit bits, transmission can be carried out without the inclusion of inhibit bits in the transmission. In this first digital transmission method of this invention, the depth data is not limited to 20 bit data. Digital data of 30 bits, 40 bits or a larger number of bits can be transmitted as m bits (for example, 10 bits) of digital data, according to preference.

Also, in a second digital data transfer method for this invention, values from 0 to a maximum value R, where this maximum value R is selected to be less than $(M-L)^N$, are selected for transmitting (N*m) bits (where N and m are positive integers having a value of 2 or greater) of digital data as digital data Z. Here, M is the number of values which can be represented by the m bit digital data, i.e. $2^m$ and L is the number of values in the transfer format which are forbidden codes. The maximum values for the twenty bit depth data Z therefore range from 0 to a maximum of $1016^2-1$ (FC03Fh).

The digital data Z is then divided up every m bits into N items of m bit digital data ranging from $V_1$ to $V_N$. This digital data is then given by $$Z = \sum_{n=1}^{N} \{M^n - 1(V_n)\}$$

i.e. it is divided up as follows $$Z=M^{N-1}(V_N)+M^{N-2}(V_{N-1})+M^{N-3}(V_{N-2})+\ldots+M(V_2)+(V_1) \quad \text{(Eqn 7)}$$

It follows that the depth data is therefore divided up between the upper and lower bits $V_2$ and $V_1$ in the following way.

$$Z=1024V_2+V_1 \quad \text{(Eqn. 8)}$$

When this (N*m) bist digital data divided up into N items of m bit digital data ranging from $V_1$ to $V_N$ by identifying when has exceeded the maximum value R in such a manner that any of these values may become an forbidden code, these forbidden code values may be substituted with preset (N*m) bit digital data which does not contain any forbidden codes. This substituted (N*m) bit digital data is then divided up every m bits in the same way as the unsubstituted (N*m) bit diigital data and transmitted as N items of m bit digital data $V_1$ to $V_N$.

It therefore follows that values L values of the M available of digital data Z correspond to digital data for forbidden codes, by using a m bit digital transfer format, transmission which does not include these stop bits can be carried out.

The digital data $V_1$ to $V_N$ can then be changed back to its original (N*m) bit digital data form on the receiving side. The digital data Z is therefore returned to its original form on the receiving side according to $$Z = \sum_{n=1}^{N} \{M^{n-1}(V_n)\} \quad \text{(Eqn. 9)}$$

If it is determined from its value that this digital data Z had undergone a substitution before having been returned to its original state, then this data can then be returned to the value it had before this substitution by using the substitution rules.

Figure 3:
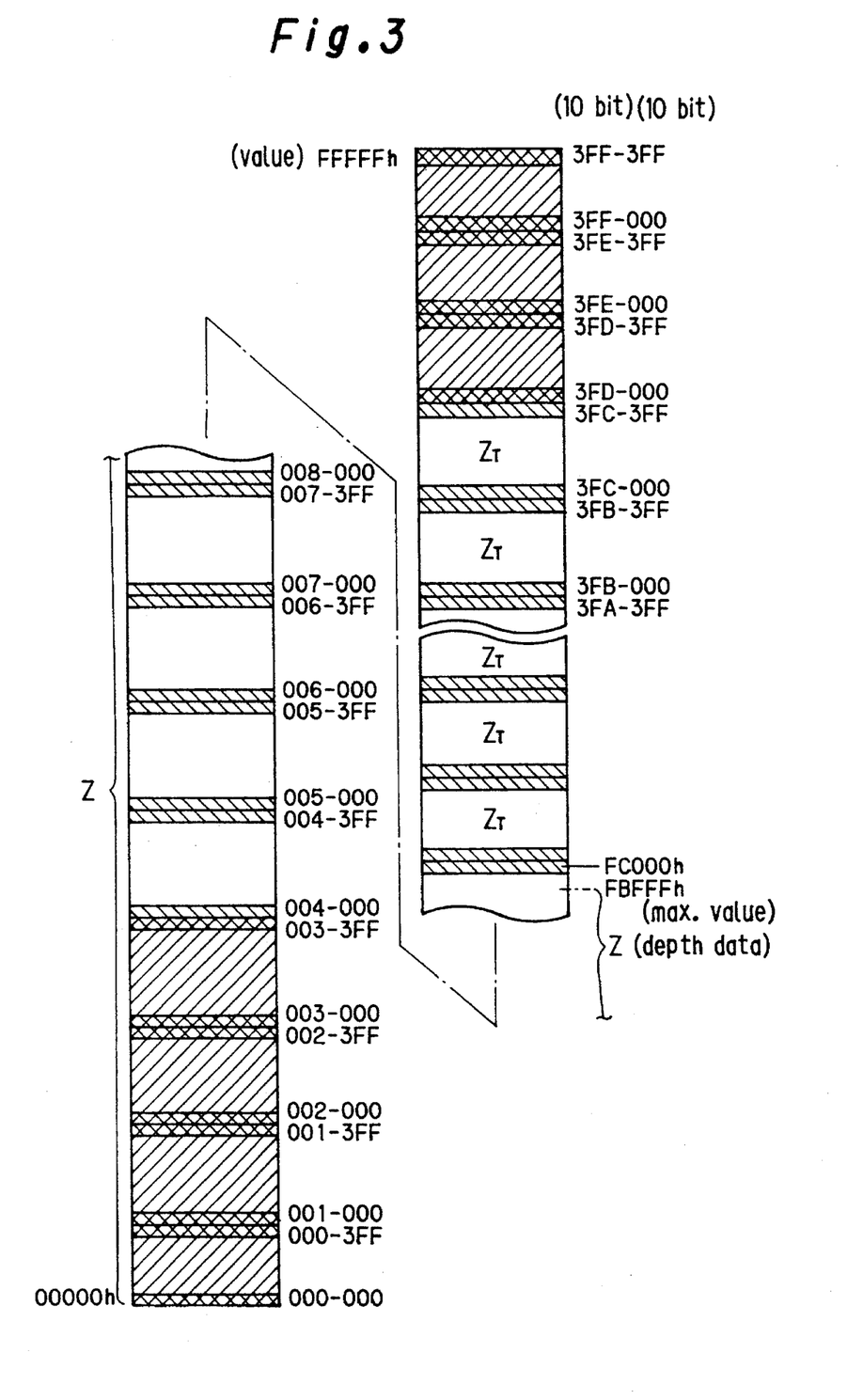
FIG. 3 is a graph describing a second digital data transmission method for this invention.

When this 20 bit depth data Z is transmitted using a 10 bit digital video data transmission format, as is shown in FIG. 3, if the maximum value R for this depth data Z is FBFFFh, and if one or both of the upper and lower bits $V_2$ and $V_1$ become inhibit bits when this depth data Z is divided, this depth data Z is substituted with 20 bit digital substitution data ZT which falls within a range from FC000h to FFFFFh ($1024^2-1$) which is larger than the maximum value R. Also, it is ensured that neither the upper bits $V_2$ nor the lower bits $V_1$ correspond to inhibit bits when this digital substitution data ZT is divided into the 10 bit upper and lower bits $V_2$ and $V_1$ in the same way as the depth data Z.

If the maximum value for the depth data Z is FBFFFh, then the number of values within the depth data, i.e. the resolution has 1032192 steps.

If the upper bits $V_2$ are a forbidden code (000h to 003h) when the depth data Z is divided up, the depth data Z is changed to digital substitution data ZT by changing this upper bit $V2$ in the way indicated by the equations (10) to (13).

| | |
|---|---|
| 000h–3F8h | (Eqn. 10) |
| 001h–3F9h | (Eqn. 11) |
| 002h–3FAh | (Eqn. 12) |
| 003h–3FBh | (Eqn. 13) |

For example, an item of depth data Z having a value of 002AAh would be split into upper bits $V_2$ of 3F8h and lower bits $V_1$ of 2AAh. The upper bits $V_2$ would then be transmitted as the upper bit transmission data $v2$ and the lower bits $V_1$ would be transmitted as the lower bit transmission data $v1$.

If the lower bits $V_1$ are a forbidden code (i.e. 000h to 003h or 3FCh to 3FFh), then the upper are allotted to the lower bits $v1$ of the transmission data. The lower bits $V_1$ are changed according to equations 14 to 21, and allotted to the upper bits $v2$ of the transmission data. The depth data Z is therefore substituted by the digital substitution data ZT. The upper bits $V_2$ into which the depth data Z was divided is allotted to the lower bits $v1$ of the transmission data at this time.

| | |
|---|---|
| 000h–3F0h | (Eqn. 14) |
| 001h–3F1h | (Eqn. 15) |
| 002h–3F2h | (Eqn. 16) |
| 003h–3F3h | (Eqn. 17) |
| 3FCh–3F4h | (Eqn. 18) |
| 3FDh–3F5h | (Eqn. 19) |
| 3FEh–3F6h | (Eqn. 20) |
| 3FFh–3F7h | (Eqn. 21) |

For example, depth data Z having a value AA800h would be transmitted as upper bit transmission data $v2$ of 3F0h and lower bit transmission data $v1$ of 2AAh.

If the upper and lower bits into which the depth data Z is divided are both forbidden codes (i.e. 000h to 003h or 3FCh to 3FFh), the upper bits $V_2$ into which the depth data Z is divided is changed according to equations 10 to 13 and assigned to the lower bits $v1$ of the transmission data. The lower bits $V_1$ is then changed according to equations 14 to 21 and is allotted to the upper bits $v2$ of the transmission data. In this way, the depth data Z is substituted by the digital substitution data ZT.

For example, depth data Z having a value of 00000h would be transmitted as an upper bit transmission data $v2$ of 3F0h and lower bit transmission data of 3F8h.

The depth data Z is then returned to its original form on the signal receiving side by obtaining 20 bit digital data with upper and lower bits $V_2$ and $V_1$ from the upper and lower bits $v2$ and $v1$ of the transmitted data. This digital data Z is then returned to its original form on the receiving side according to the equation $$Z = 1024 V_2 + V_1 \qquad \text{(Eqn. 22)}$$

It can then be determined if the transmitted signal has undergone substitution if value of the depth data which has been returned to its original form is greater than R. If it is determined that a substituted transmission signal is present, the depth data Z can be returned to its value before the substitution by following the substitution laws.

Figure 4:
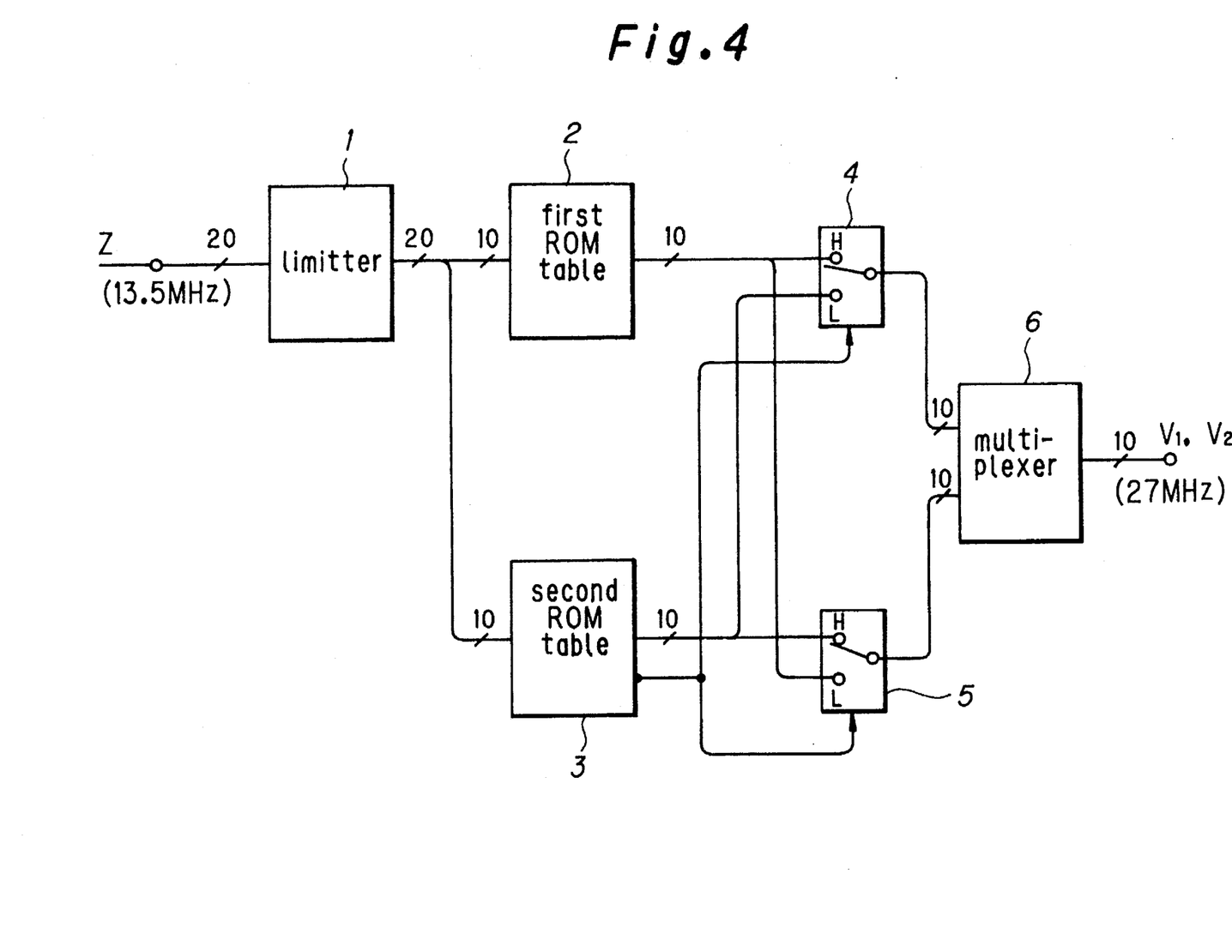
FIG. 4 is a block diagram of the construction of an encoding apparatus for carrying out the second digital data transfer method.

The kind of encoding apparatus used for transmitting the depth data Z in the second digital data transmission method in this invention is made up of first and second ROM tables 2 and 3 for carrying out substitutions for the depth data Z, as is shown in FIG. 4. In this encoding apparatus, 20 bit depth data Z is provided to a limiter circuit 1 at a clock rate of, for example, 13.5 MHz. This limiter is for cutting data which exceeds the maximum value R for the depth data Z (for example, FBFFFh).

The upper 10 bits of the depth data Z which pass through this limiter circuit 1 are sent to the first ROM table 2 and the lower ten bits are sent to the second ROM table 3. At this first ROM table 2, if the upper 10 bits which have been sent do not represent a forbidden code, the sent code is outputted. If these ten bits do represent a forbidden code, a code which has been determined previously in the equations from 10 to 13 is outputted. The output from this first ROM table is then sent to the first and second switches 4 and 5.

At the second ROM table 3, if the lower 10 bits which have been sent do not represent a forbidden code, the sent code is outputted. If these ten bits do represent a forbidden code, a code which has been determined previously in the equations from 14 to 21 is outputted. The output from this second ROM table is then sent to the first and second switches 4 and 5. This second ROM table 3 also outputs a control signal L to the switches 4 and 5 if the lower 10 bits represented a forbidden code.

When a control signal "H" is provided to the first switch 4 by the second ROM table 3 the output from the first ROM table 2 is taken as the transmission signal data upper bits $v2$ and is sent to the multiplexer 6. Also, when the second switch 5 is provided with a control signal "H" from the second ROM table 3, the output from the second ROM table 3 is sent to the multiplexer 6 as the transmission data lower bits $v1$.

So, when the control signal becomes "L", the first switch 4 takes the output from the second ROM table 3 as the transmission signal data upper bits $v2$ and sends it to the multiplexer 6 and the second switch 5 takes the output from the first ROM table 2 as the transmission signal data lower bits $v1$ and sends it to the multiplexer 6.

The multiplexer 6 then multiplexes the upper and lower bits $v1$ and $v2$ provided by the switches 4 and 5 so as to give an output of 10 bit digital data having a clock rate of 27 MHz. This digital data can then be transmitted via, for example, a single transmission cable in the same way as digital video data.

Figure 5:
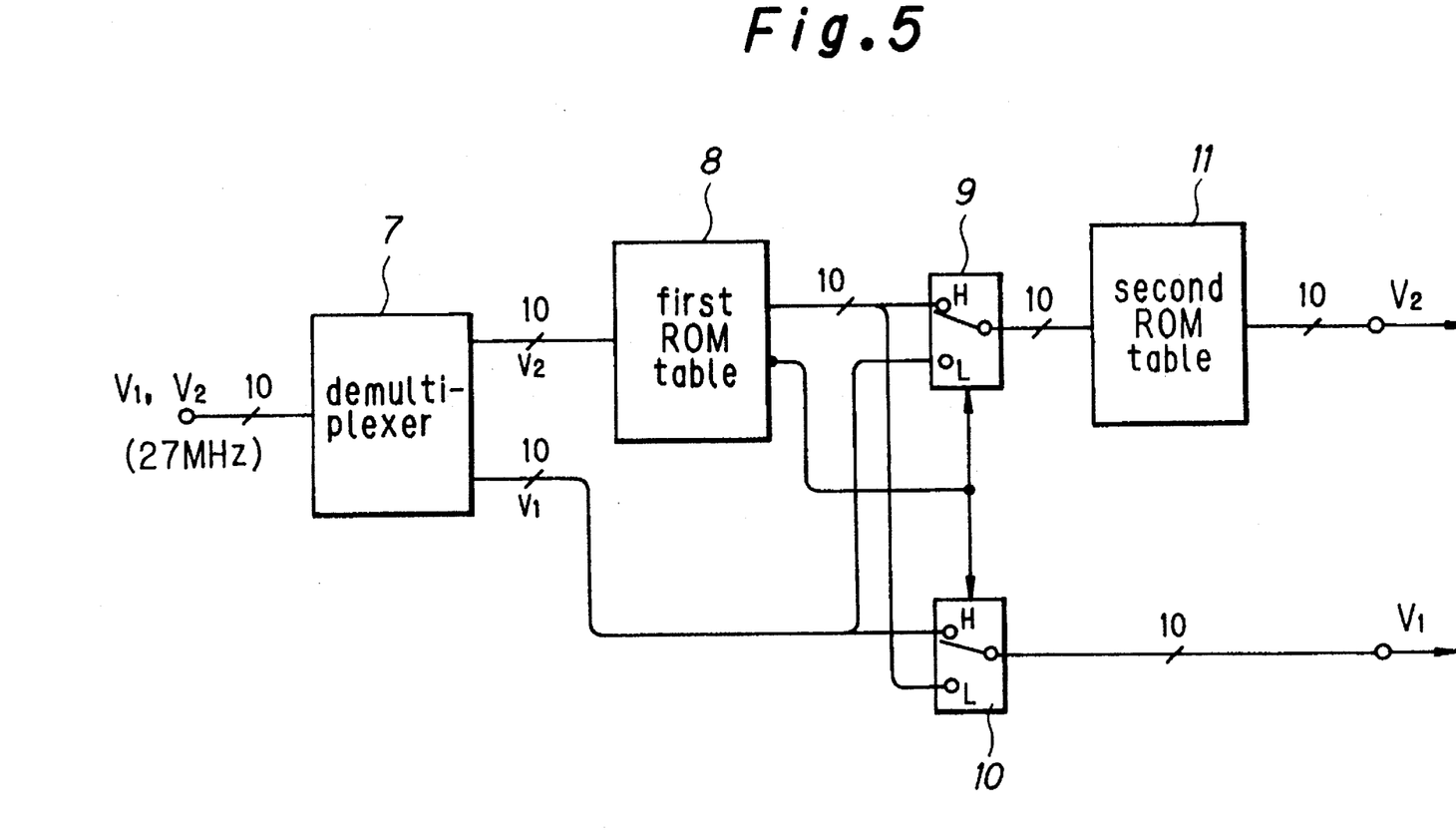
FIG. 5 is a block diagram showing the construction of a decoding apparatus for receiving data transmitted by the second digital data transmission method.

Also, as is shown in FIG. 5, the decoding apparatus which returns depth data which has been transmitted via the encoding apparatus to its original state is made up of first and second ROM tables 8 and 11 for changing the upper and lower bits $v2$ and $v1$ of the sent transmission signal data so it returns to being the depth data Z. At this encoding apparatus, the upper and lower bits $v2$ and $v1$ of the transmission data serially sent as 10 bit digital data at a clock rate of 27 MHz are inputted to the de-multiplexer 7, where they are split up into two streams of 10 bit digital data having a clock rate of 13.5 MHz. The upper bits $v2$ of the transmission data isolated by this demultiplexer 7 is then sent to the first ROM table 8 and the lower $V_1$ of the transmission data isolated by the demultiplexer 7 are sent to the first and second switches 9 and 10.

If the upper bits $v_2$ of the transmission data which has been sent are not a forbidden code which has to be modified according to any of the equations 14 to 21 then it is outputted without modification from the first ROM table 8. If the upper bits $v_2$ of the transmission data which has been sent is a forbidden code which has to be modified, then this modification is carried out according to the system shown by the equations 14 to 21 and, as is shown in the following equations 23 to 30, a predetermined code is taken as the lower bits $V_1$, and outputted.

| | |
|---|---|
| 3F0h–000h | (Eqn. 23) |
| 3F1h–001h | (Eqn. 24) |
| 3F2h–002h | (Eqn. 25) |
| 3F3h–003h | (Eqn. 26) |
| 3F4h–3FCh | (Eqn. 27) |
| 3F5h–3FDh | (Eqn. 28) |
| 3F6h–3FEh | (Eqn. 29) |
| 3F7h–3FFh | (Eqn. 30) |

The output from this first ROM table is then sent to the first and second switches 9 and 10. Also, when this first ROM table 8 carries out a code substitution according to the equations 23 to 30 if the upper bits $v_2$ of the transmission data corresponds to an forbidden code, a control signal "L" is outputted to the switches 9 and 10.

When a control signal "H" is being provided to the first switch 9 by the first ROM table 8, the output from the first ROM table 8 is taken as the upper bits $V_2$ and is sent to the second ROM table 11. Also, when a control signal "H" is provided to the second switch 10 by the first ROM table 8, the lower bit $v_1$ of the transmission signal data is taken as the lower bits $V_1$ and is outputted without modification.

Then, when the control signal becomes "L", the first switch 9 takes the transmission signal data lower bits $v_1$ as the upper bits $V_2$ and sends it to the second ROM table 11. The second switch 10 then takes the output from the first ROM table 8 as the lower bit $V_1$ and outputs it without modification.

If the transmitted 10 bit digital data does not correspond to a forbidden code which has to be substituted according to the equations 10 to 13, it is taken by the second ROM table 11 as the lower bits $V_2$ and is outputted without modification. If this digital data does correspond to a forbidden code which has to be substituted according to equations 10 to 13, then this substitution is carried out, and as is shown in the following equations 31 to 34, a predetermined code is taken as the upper bits $V_2$, and outputted.

| | |
|---|---|
| 3F8h–000h | (Eqn. 31) |
| 3F9h–001h | (Eqn. 32) |
| 3FAh–002h | (Eqn. 33) |
| 3FBh–003h | (Eqn. 34) |

The depth data Z can then be returned to its original state using the upper and lower bits $V_2$ and $V_1$.

The second digital data transmission method for this invention described above would also be suitable for use with 30 bit or 40 bit digital data transmission.

With 30 bit digital data transmission, 3E80FC08h (=$1016^3$) values can be expressed. Here, the maximum value of R for intended transmission is taken as 3E7FFFFFh and the header substitution region for the digital data which will include forbidden codes i.e. the digital substitution data ZT will have a range from 3E800000h to 3E80FC08h. This 30 bit digital data will first be divided into an upper 10 bits and a lower 20 bits. It is best to obtain data less than FC000h from the Z data using the methods described previously for the lower 20 bits. It is therefore preferable to provide substitution for the upper 10 bits of the lower 20 bits i.e. the middle 10 bits so that they fall within the range of greater than 000h to less than 3F0h.

When the upper 10 bits correspond to a forbidden code i.e. when the upper 10 bits fall within the region from 000h to 003h, these upper 10 bits are substituted according to the following equations 35 to 38.

| | |
|---|---|
| 000h–3E8h | (Eqn. 35) |
| 001h–3E9h | (Eqn. 36) |
| 002h–3EAh | (Eqn. 37) |
| 003h–3EBh | (Eqn. 38) |

For example, 002AAAAAh would be divided up into the upper 10 bits 002h, the middle 10 bits 2AA and the lower 10 bits 2AA, of which the upper 10 bits would be substituted by 3EAh.

Also, if the lower 20 bits include a forbidden code, i.e. if the middle 10 bits are in the region greater than 3F0, these middle 10 bits are substituted and taken as the upper bits of the transmission signal data, as is shown by the following equations 39 to 46.

| | |
|---|---|
| 3F0h – 3F0h | (Eqn. 39) |
| 3F1h – 3F1h | (Eqn. 40) |
| " | " |
| " | " |
| " | " |
| 3FAh – 3FAh | (Eqn. 41) |
| 3FBh – 3FBh | (Eqn. 42) |
| 3FCh – 3ECh | (Eqn. 43) |
| 3FDh – 3EDh | (Eqn. 44) |
| 3FEh – 3EEh | (Eqn. 45) |
| 3FFh – 3EFh | (Eqn. 46) |

For example, 2AAFF000h would first be divided into an upper ten bits 2AAh, a middle 10 bits 3FCh and a lower 10 bits 000h. The middle 10 bits from these are then substituted by 3ECh and are allotted to the upper ten bits of the transmission data. By carrying out this substitution, the upper ten bits are substituted from the values 2AAh to the values 3ECh, so that a forbidden code is no longer included. Also, the lower 20 bits are changed from FF000h to AA800h and are then re-substituted by the substitution method for the 20 bit depth data Z described beforehand. In the most extreme case, 3ECFC2AAh can be divided into three items of 10 bit digital data of an upper 10 bits 3ECh, a middle 10 bits 3F0h and a lower 10 bits of 2AA which do not include inhibit bits.

With regards to 40 bit digital data, forbidden codes can be expressed using a value such as F817E0154Ah. Here, by taking the maximum value for transmission R to be F7FFFFFFFFh, values lower than this can be made to include forbidden codes for digital data in a leading substitution region i.e. the range for the digital substitution data would be above F800000000h. Let the first upper 10 bits and the second upper ten bits be considered first. The maximum value number which the first upper 10 bits can have is 3DFh. As described previously, it is better if the following 30 bits can then have a value which is less than 3E800000h. It then follows that if the value for the second upper 10 bits is equal to or greater than 3E8h, a value equal to or greater than F800000000h is substituted (the region where the value for the 10 bits is equal to or greater than 3E0h). The following 30 bits are then divided up in the way described previously.

If the first upper 10 bits represent a forbidden code i.e. if they are less than 004h, these first upper 10 bits are substituted according to the following equations 47 to 50.

| | |
|---|---|
| 000h–3E0h | (Eqn. 47) |
| 001h–3E1h | (Eqn. 48) |
| 002h–3E2h | (Eqn. 49) |
| 003h–3E3h | (Eqn. 50) |

For example, 00AAAAAAAh would first be divided up into a first upper 10 bits 002h, a second upper 10 bits of 2AAh, a first lower 10 bits of 2AAh and a second lower 10 bits of 2AAh. From these, the first upper ten bits would be substituted by 3E2h.

Also, if the following 30 bits included a forbidden code, i.e. if the second upper 10 bits were equal to or above 3E8, these second upper 10 bits would be substituted according to the following equations 51 to 60 and would be allotted to the first upper bits of the transmission data.

| | |
|---|---|
| 3E8h – 3E8h | Eqn. 51) |
| 3E9h – 3E9h | (Eqn. 52) |
| " | " |
| " | " |
| 3F0h – 3F0h | (Eqn. 53) |
| 3F1h – 3F1h | (Eqn. 54) |
| " | " |
| " | " |
| " | " |
| 3FAh – 3FAh | (Eqn. 55) |
| 3FBh – 3FBh | (Eqn. 56) |
| 3FCh – 3E4h | (Eqn. 57) |
| 3FDh – 3E5h | (Eqn. 58) |
| 3FEh – 3E6h | (Eqn. 59) |
| 3FFh – 3E7h | (Eqn. 60) |

For example, AABFCAAAAAh would first be divided into a first upper ten bits of 2AAh, a second upper 10 bits of 3FCh, a first lower 10 bits of 2AA and a second lower 10 bits of 2AAh. Of these, the second upper 10 bits are substituted by 3E4h and allotted to the first upper 10 bits of the transmission data. In the extreme case, F92AAAAAAh would be substituted to four items of 10 bit digital data with the first upper ten bits being 3E4h, the second upper 10 bits being 2AAh, the first lower 10 bits being 2AAh and the second lower 10 bits being 2AAh.

By using this kind of substitution, even digital data which has a large number of bits can be split up into 10 bit packages which do not include inhibit bits. By successively carrying out substitutions for the first upper 10 bits and the second 10 bits and then for the first lower 10 bits and the second lower 10 bits in the same way, the transmission data can be divided into 10 bit packages. In this case, the data limit for the first upper 10 bits for 50 bit data would be 3D7h, and the data limit for the first upper 10 bits for 60 bit data would be 3CFh i.e. the limit for the first upper 10 bits of data would go down by eight for each 10 bit increase in the number of bits in the digital data.

Also, if 40 bit digital data is transmitted using the digital data transmission method in this invention, substitution can be carried out after this 40 bit data has been divided up into 20 bit packages. Here, FBFFFh will be taken as the maximum value R used to express the 20 bit packages of digital data. The upper 20 bits are set to a limit of F7FFFh. If the lower 20 bits are then equal to or greater than FC000h, the upper 20 bits are allotted to the lower 20 bits of transmission data. The previous lower 20 bits are then substituted according to the following equations 61 to 64 and are allotted to the upper 20 bits of the transmission data.

| | |
|---|---|
| FC000h – F8000h | (Eqn. 61) |
| FC001h – F8001h | (Eqn. 62) |
| " | " |
| " | " |
| " | " |
| FFFFEh – FBFFEh | (Eqn. 63) |
| FFFFFh – FBFFFh | (Eqn. 64) |

By carrying out these kinds of substitutions, the upper 20 bits and the lower 20 bits will be substituted for values greater than or equal to 00000h and less than FC000. These 20 bit packages of digital data can then be split up into 10 bit packages of digital data. By using this kind of conversion method, the process can be carried out at greater speed than where the conversion is carried out successively from the upper side.

In the case where digital data is transmitted in packets of 50 bits or more, the digital data can be divided into 10 bit packages which do not include forbidden codes by using a combination of the method where the source digital data is split up into two lots of 20 bits of data and the method where substitutions are carried out successively from the upper side, and this is shown in the following.

$$
\begin{aligned}
50 \text{ (bit)} - 10 \text{ (bit)} + 40 \text{ (bit)} - \\
10 \text{ (bit)} + 20 \text{ (bit)} + 20 \text{ (bit)} - \\
10 \text{ (bit)} + 10 \text{ (bit)} + 10 \text{ (bit)} + 10 \\
\text{(bit)} \quad \text{(Eqn. 65)}
\end{aligned}
$$

$$
\begin{aligned}
60 \text{ (bit)} - 30 \text{ (bit)} + 30 \text{ (bit)} - \\
10 \text{ (bit)} + 20 \text{ (bit)} + 10 \text{ (bit)} + 20 \text{ (bit)} - \\
10 \text{ (bit)} + 10 \text{ (bit)} + 10 \text{ (bit)} + 10 \text{ (bit)} + \\
10 \text{ (bit)} + 10 \text{ (bit)} \quad \text{(Eqn. 66)}
\end{aligned}
$$

In the digital data transmission method for this invention, the (N*m) bit digital data Z can be expressed by $$Z = \Sigma_{n=1}^{N} \{(M-L)^{n-1}(V_n - K)\} \qquad \text{(Eqn. 2)}$$

$$Z = (M-L)^{N-1}(V_n - K) + (M-L)^{N-2}(V_{N-1} - K) +$$

$$(M-L)^{N-3}(V_{N-2} - K) + \ldots +$$

$$(M-L)(V_2 - K) + (V_1 - K)$$

where N items of m bit digital data $V_1$ to $V_N$ are divided up and transmitted. Here, M represents the number of values which can be expressed by the m bits of digital data i.e. $2^m$, K represents the number of values going sequentially from the minimum value within the M values which represent forbidden codes in this transmission format and L is the number of values which are forbidden codes in the M values.

It follows that in the digital data Z, the first K values from the minimum value within the M values correspond to digital data for forbidden codes. L values within these M values correspond to digital data for forbidden codes. This information can then be transmitted without the forbidden code depending on the transmission format for the m bit digital data.

This transmitted digital data Z is then returned to its original form on the receiving side in accordance with the following equation.

$$Z = \Sigma_{n=1}^{N} \{(M-L)^{n-1}(V_n - K)\}$$

Also, in a digital data transmission method for this invention, (N*m) bit digital data Z (where N and m are positive integers greater than or equal to 2) is to be transferred as data with a value of 0 to a maximum value of R where this maximum value R is less than $(M-L)^N$. This digital data Z is divided up every m bits into N, m bit packets of digital data $V_1$ to $V_N$, and then transmitted. Here, M is the number of values which can be expressed by the m bit digital data i.e. $2^m$ and L is the number of values within the transmission format which are forbidden codes.

If any of the N items of m bit digital data $V_1$ to $V_N$ represent forbidden codes, the (N*m) bit digital data When this (N*m) bit digital data is divided up into N items of m bit digital data ranging from $V_1$ to $V_N$ by identifying when the value has exceeded the maximum value R in such a manner that any of these values may become a forbidden code, these forbidden code values may be substituted with preset (N*m) bit digital data which does not contain any forbidden codes. This substituted (N*m) bit digital data is then divided up every m bits to be transmitted as N items of m bit digital data $V_1$ to $V_N$.

it therefore follows that while L values of the M values within the digital data Z correspond to digital data for forbidden codes, by using an N bit digital transfer format, transmission which does not include these inhibit bits can be carried out.

The digital data Z is then divided up every m bits into N items of m bit digital data ranging from $V_1$ to $V_N$. This digital data is then given by $$Z = \Sigma_{n=1}^{N} \{M^{n-1}(V_n)\}$$

i.e. it is divided up as follows $$Z = M^{N-1}(V_N) + M^{N-2}(V_{N-1}) + M^{N-3}(V_{N-2}) + \ldots + M(V_2) + (V_1)$$

The digital data $V_1$ to $V_N$ can then be changed back to its original (N*m) bit digital data form on the receiving side. The digital data Z is therefore returned to its original form on the receiving side according to $$Z = \Sigma_{n=1}^{N} \{M^{n-1}(V_n)\}$$

Furthermore, in each of the above digital data transmission methods, when the digital data Z is used as the depth data for image processing apparatus, a digital data Z 20 bits in length can provide sufficient resolution.

The present invention therefore provides a digital data transmission method in which a transmission format having forbidden codes transmitting a predetermined number of bits at a time (i.e. 10), in such a manner that when digital data having a bit number which is larger than the predetermined bit number in the transmission format (i.e. 20) is handled, this digital data can be transmitted efficiently and accurately in accordance with the transmission format.

What is claimed is:

1. A method for transferring (N*m) bit depth data Z for digital image processing apparatus using an m-bit digital data transfer format, N being a positive integer greater than or equal to 2, M being a number of values representable by m bits of digital data first K sequential values starting from a lowest of the M values of the m-bit digital data being forbidden codes in the m-bit digital data transfer format which are reserved for control information and information other than image data, and L values within the M values of the m-bit digital data being forbidden codes in the m-bit digital data transfer format, comprising the steps of:

(a) dividing the (N*m) bit depth data Z into N items of m-bit digital data $V_1$ to $V_N$, where $$Z = \Sigma_{n=1}^{N} \{(M-L)^{n-1}(V_n - K)\} \text{ and}$$
$$Z = (M-L)^{N-1}(V_N - K) + (M-L)^{N-2}(V^{N-1} - K) + (M-L)^{N-3}(V_{N-2} - K) + \ldots + (M-L)(V_2 - K) + (V_1 - K);$$

(b) transmitting the m-bit digital data $V_1$ to $V_N$ obtained in step (a) along with control information and information other than picture data using the m-bit digital data transfer format;

(c) receiving the transmitted m-bit digital data $V_1$ to $V_N$; and (d) restoring the received m-bit digital data $V_1$ to $V_N$ to a form of the (N*m) bit depth data Z based on the equation $$Z = \Sigma_{n=1}^{N} \{(M-L)^{n-1}(V_n - K)\}.$$

2. A method according to claim 1, wherein the depth data Z is 20 bits and m is 10.

3. A method for transferring (N*m) bit depth data Z for digital image processing apparatus using an m-bit digital data transfer format, M being a number of values representable by m bits of digital data, first K sequential values starting from a lowest of the M values being forbidden codes in the m-bit digital data transfer format which are reserved for control information and information other than image data, L values within the M values of the m-bit digital data being forbidden codes in the m-bit digital data transfer form N being a positive integers greater than or equal to 2, and the (N*m) bit depth data Z having a value ranging from zero to a maximum value R which is less than $(M-L)^N$, comprising the steps of:

(a) dividing the (N*m) bit depth data Z into N items of m-bit digital data V1 to VN;

(b) detecting if any one of the N items of m-bit digital data V1 to VN is a forbidden code;

(c) if any one of the N items of m-bit digital data V1 to VN is a forbidden code, replacing the N items of m-bit digital data with a corresponding preset N items of m-bit digital data which is greater than N items of m-bit digital data corresponding to the maximum value R, none of the corresponding preset N items of m-bit digital data V1 to VN being forbidden codes;

(d) transmitting the N items of m-bit digital data V1 to VN along with control information and information other than picture data;

(e) receiving the transmitted data including the N items of m-bit digital data V1 to VN; and (f) restoring the received N items of m-bit digital data V1 to VN the form of the (N*m) bit depth data Z.

4. A method according to claim 3, wherein the depth data Z is 20 bits and m is 10.

* * * * *

UNITED STATES PATENT AND TRADEMARK OFFICE
CERTIFICATE OF CORRECTION

PATENT NO. : 5,487,019

DATED : January 23, 1996

INVENTOR(S) : Motomu Ueta & Tetsuya Harada

It is certified that error appears in the above-identified patent and that said Letters Patent is hereby corrected as shown below:

Col.1, line 21, after "hexidecimal" insert --.--
      line 56, after "is" second occurrence, insert --,--
      line 66, after "bits" insert --do--
Col.5, line 45, change "$1016^2$" to --$1016^2-1$--
      line 52, change "$\Sigma_{n-1}^N$" to --$\Sigma_{n=1}^N$--.
      same line, change "(M-L)n-1" to --$(M-L)^{n-1}$--
      line 57, change "(1016)n-1" to --$(1016)^{n-1}$ --
Col.6, line 19, change "$M^n-1$" to --$M^{n-1}$--
      line 30, change "bist" to --bit--
      line 40, after "that" insert --while--
      same line, delete "values" first occurrence
Col.7, line 59, after "and" insert --a--
Col.13, line 15, after "data" insert --.--
      line 25, change "it" to --It--
      line 54, after "codes" insert --and--

UNITED STATES PATENT AND TRADEMARK OFFICE
CERTIFICATE OF CORRECTION

PATENT NO. : 5,487,019
DATED : January 23, 1996
INVENTOR(S) : Motomu Ueta & Tetsuya Harada It is certified that error appears in the above-identified patent and that said Letters Patent is hereby corrected as shown below:

Col.14, line 1, after "data" insert --,--
line 12, change "$(V^{N-1}$" to -- $(V_{N-1}$--
line 37, change "form" to --format--
line 60, after "VN" insert --to--

Signed and Sealed this

Thirteenth Day of January, 1998

Attest:

Attesting Officer

BRUCE LEHMAN

Commissioner of Patents and Trademarks